(12) United States Patent
Iwasa

(10) Patent No.: US 7,464,296 B2
(45) Date of Patent: Dec. 9, 2008

(54) SYSTEM AND METHOD FOR IDENTIFYING FAILURE CANDIDATES IN A SEMICONDUCTOR APPARATUS

(75) Inventor: Chie Iwasa, Kanagawa-Ken (JP)

(73) Assignee: Kabushiki Kaisha Toshiba (JP)

( * ) Notice: Subject to any disclaimer, the term of this patent is extended or adjusted under 35 U.S.C. 154(b) by 561 days.

(21) Appl. No.: 11/128,136

(22) Filed: May 11, 2005

(65) Prior Publication Data

US 2005/0256655 A1 Nov. 17, 2005

(30) Foreign Application Priority Data

May 12, 2004 (JP) ............................. 2004-142091

(51) Int. Cl.
*G06F 11/00* (2006.01)
(52) U.S. Cl. ...................... 714/33; 714/729; 714/734
(58) Field of Classification Search .................... 714/33
See application file for complete search history.

(56) References Cited

U.S. PATENT DOCUMENTS

| | | | | |
|---|---|---|---|---|
| 6,308,293 | B1 * | 10/2001 | Shimono | 714/741 |
| 6,397,362 | B1 * | 5/2002 | Ishiyama | 714/724 |
| 7,043,384 | B2 * | 5/2006 | Matsushita et al. | 702/81 |
| 7,238,958 | B2 * | 7/2007 | Iizuka | 250/559.29 |
| 2002/0176288 | A1 * | 11/2002 | Nozuyama | 365/200 |
| 2006/0028229 | A1 * | 2/2006 | Subramaniam et al. | 324/765 |

FOREIGN PATENT DOCUMENTS

JP P2000-155156 A 6/2000

* cited by examiner

*Primary Examiner*—Scott T. Baderman
*Assistant Examiner*—Kamini Patel
(74) *Attorney, Agent, or Firm*—DLA Piper LLP (US)

(57) ABSTRACT

A failure candidates identifying system has a tree structure in which input patterns selected from a failure dictionary are set as nodes. The failure candidates identifying system comprises a failure candidates searching tree in which an input pattern does not exist with overlapping in a route from a root node of the nodes. A searching tree generating unit is configured to set as a child node of the node by selecting an input pattern of the smallest absolute value of a difference between a detect failure number at the observed failure mode and an un-detect failure number from the failure dictionary by observing a Detect failure or an un-detected failure at the input pattern of the node in case of the node has a child node. A failure candidates searching unit is configured to extract the failure candidates by searching a D-node being set as the child node with observing the un-detect failure based on a fail data indicating "Pass" or "Fail" among the fail logs when the fail data is "Fail" and by searching a U-node being set as the child node with observing the detect failure without searching the D-node when the fail data is "Pass".

11 Claims, 14 Drawing Sheets

| FAILURE MODE | ROUTE DATA | | | |
|---|---|---|---|---|
| | DEPTH "0" | DEPTH "1" | DEPTH "2" | DEPTH "3" |
| A | [0] 1-4 "Fail" | [1] 1-5 "Pass" | [4] 1-1 "Fail" | |
| B | [0] 1-4 "Pass" | [2] 1-1 "Fail" | [5] 1-2 "Fail" | |
| C | [0] 1-4 "Fail" | [1] 1-5 "Fail" | [3] 1-1 "Fail" | |
| D | [0] 1-4 "Pass" | [2] 1-1 "Fail" | [5] 1-2 "Pass" | |
| E | [0] 1-4 "Fail" | [1] 1-5 "Pass" | [4] 1-1 "Pass" | [8] 1-3 "Pass" |
| F | [0] 1-4 "Pass" | [2] 1-1 "Pass" | [6] 1-3 "Pass" | [9] 1-5 "Pass" |
| G | [0] 1-4 "Fail" | [1] 1-5 "Fail" | [3] 1-1 "Pass" | [7] 1-3 "Pass" |
| H | [0] 1-4 "Pass" | [2] 1-1 "Pass" | [6] 1-3 "Pass" | [9] 1-5 "Fail" |
| I | [0] 1-4 "Fail" | [1] 1-5 "Fail" | [3] 1-1 "Pass" | [7] 1-3 "Fail" |
| J | [0] 1-4 "Pass" | [2] 1-1 "Pass" | [6] 1-3 "Fail" | |
| K | [0] 1-4 "Fail" | [1] 1-5 "Pass" | [4] 1-1 "Pass" | [8] 1-3 "Fail" |

FIG. 5

[0] 1-4
D-CANDIDATES TABLE

| | | FAILURE MODE | | | | | | | | | | FAILURE MODE NUMBER | |
| --- | --- | --- | --- | --- | --- | --- | --- | --- | --- | --- | --- | --- | --- |
| | | A | B | C | D | E | F | G | H | I | J | K | D-FAILURE | U-FAILURE |
| TEST PATTERN 1 | ADDRESS 1 | - | D | - | D | - | U | - | U | - | - | U | 2 | 4 |
| | ADDRESS 2 | - | D | - | U | - | U | - | U | - | - | U | 1 | 5 |
| | ADDRESS 3 | - | U | - | U | - | U | - | U | - | - | D | 2 | 4 |
| | ADDRESS 4 | - | - | - | - | - | - | - | - | - | - | - | - | - |
| | ADDRESS 5 | - | U | - | D | - | U | - | D | - | D | U | 3 | 3 |

FIG. 7A  ⇐ D-NODE (DEPTH "1")

[0] 1-4
U-CANDIDATES TABLE

| | | FAILURE MODE | | | | | | | | | | FAILURE MODE NUMBER | |
| --- | --- | --- | --- | --- | --- | --- | --- | --- | --- | --- | --- | --- | --- |
| | | A | B | C | D | E | F | G | H | I | J | K | D-FAILURE | U-FAILURE |
| TEST PATTERN 1 | ADDRESS 1 | - | D | - | D | - | U | - | U | - | U | - | 2 | 3 |
| | ADDRESS 2 | - | D | - | U | - | U | - | U | - | U | - | 1 | 4 |
| | ADDRESS 3 | - | - | - | U | - | U | - | U | - | D | - | 1 | 4 |
| | ADDRESS 4 | - | - | - | - | - | - | - | - | - | - | - | - | - |
| | ADDRESS 5 | - | U | - | D | - | U | - | D | - | D | - | 3 | 2 |

FIG. 7B  ⇐ U-NODE (DEPTH "1")

FIG. 8A

[1] 1-5
D-CANDIDATES TABLE

D-NODE (DEPTH "2") ⇓

| | | FAILURE MODE | | | | | | | | | | | FAILURE MODE NUMBER | |
|---|---|---|---|---|---|---|---|---|---|---|---|---|---|---|
| | | A | B | C | D | E | F | G | H | I | J | K | D-FAILURE | U-FAILURE |
| TEST PATTERN 1 | ADDRESS 1 | - | - | D | - | - | - | - | - | U | - | - | 1 | 2 |
| | ADDRESS 2 | - | - | U | - | - | - | - | U | U | - | - | 0 | 3 |
| | ADDRESS 3 | - | - | U | - | - | - | - | U | D | - | - | 1 | 2 |
| | ADDRESS 4 | - | - | - | - | - | - | - | - | - | - | - | - | - |
| | ADDRESS 5 | - | - | - | - | - | - | - | - | - | - | - | - | - |

FIG. 8B

[1] 1-5
U-CANDIDATES TABLE

U-NODE (DEPTH "2") ⇓

| | | FAILURE MODE | | | | | | | | | | | FAILURE MODE NUMBER | |
|---|---|---|---|---|---|---|---|---|---|---|---|---|---|---|
| | | A | B | C | D | E | F | G | H | I | J | K | D-FAILURE | U-FAILURE |
| TEST PATTERN 1 | ADDRESS 1 | D | - | - | - | U | - | - | - | - | - | U | 1 | 2 |
| | ADDRESS 2 | D | - | - | - | U | - | - | - | - | - | U | 1 | 2 |
| | ADDRESS 3 | U | - | - | - | U | - | - | - | - | - | D | 1 | 2 |
| | ADDRESS 4 | - | - | - | - | - | - | - | - | - | - | - | - | - |
| | ADDRESS 5 | - | - | - | - | - | - | - | - | - | - | - | - | - |

[2] 1-1 D-CANDIDATES TABLE  D-NODE (DEPTH "2")

| | | A | B | C | D | E | F | G | H | I | J | K | FAILURE MODE NUMBER | |
|---|---|---|---|---|---|---|---|---|---|---|---|---|---|---|
| | | | | | | | | | | | | | D-FAILURE | U-FAILURE |
| TEST PATTERN 1 | ADDRESS 1 | - | - | - | - | - | - | - | - | - | - | - | - | - |
| | ADDRESS 2 | - | D | - | U | - | - | - | - | - | - | - | 1 | 1 |
| | ADDRESS 3 | - | - | U | U | - | - | - | - | - | - | - | 0 | 2 |
| | ADDRESS 4 | - | - | - | - | - | - | - | - | - | - | - | - | - |
| | ADDRESS 5 | - | U | - | D | - | - | - | - | - | - | - | 1 | 1 |

FIG. 8C

[2] 1-1 U-CANDIDATES TABLE  U-NODE (DEPTH "2")

| | | A | B | C | D | E | F | G | H | I | J | K | FAILURE MODE NUMBER | |
|---|---|---|---|---|---|---|---|---|---|---|---|---|---|---|
| | | | | | | | | | | | | | D-FAILURE | U-FAILURE |
| TEST PATTERN 1 | ADDRESS 1 | - | - | - | - | - | - | - | - | - | - | - | - | - |
| | ADDRESS 2 | - | - | - | - | U | U | - | - | - | U | - | 0 | 3 |
| | ADDRESS 3 | - | - | - | - | U | U | - | - | - | - | - | 1 | 2 |
| | ADDRESS 4 | - | - | - | - | - | - | - | - | - | - | - | - | - |
| | ADDRESS 5 | - | - | - | - | U | - | D | - | - | D | - | 2 | 1 |

[3] 1-1
U-CANDIDATES TABLE

| | | FAILURE MODE | | | | | | | | | | | FAILURE MODE NUMBER | |
|---|---|---|---|---|---|---|---|---|---|---|---|---|---|---|
| | | A | B | C | D | E | F | G | H | I | J | K | D-FAILURE | U-FAILURE |
| TEST PATTERN 1 | ADDRESS 1 | - | - | - | - | - | - | - | - | - | - | - | - | - |
| | ADDRESS 2 | - | - | - | - | - | - | U | U | - | - | - | 0 | 2 |
| | ADDRESS 3 | - | - | - | - | - | - | U | D | - | - | - | 1 | 1 |
| | ADDRESS 4 | - | - | - | - | - | - | - | - | - | - | - | - | - |
| | ADDRESS 5 | - | - | - | - | - | - | - | - | - | - | - | - | - |

← U-NODE (DEPTH "3")

FIG. 9B

[4] 1-1
U-CANDIDATES TABLE

| | | FAILURE MODE | | | | | | | | | | | FAILURE MODE NUMBER | |
|---|---|---|---|---|---|---|---|---|---|---|---|---|---|---|
| | | A | B | C | D | E | F | G | H | I | J | K | D-FAILURE | U-FAILURE |
| TEST PATTERN 1 | ADDRESS 1 | - | - | - | - | - | - | - | - | - | - | - | - | - |
| | ADDRESS 2 | - | - | - | - | U | - | - | - | - | - | U | 0 | 2 |
| | ADDRESS 3 | - | - | - | - | U | - | - | - | - | - | D | 1 | 1 |
| | ADDRESS 4 | - | - | - | - | - | - | - | - | - | - | - | - | - |
| | ADDRESS 5 | - | - | - | - | - | - | - | - | - | - | - | - | - |

← U-NODE (DEPTH "3")

FIG. 9C

[6] 1-3
U-CANDIDATES TABLE

| | | FAILURE MODE | | | | | | | | | | | FAILURE MODE NUMBER | |
|---|---|---|---|---|---|---|---|---|---|---|---|---|---|---|
| | | A | B | C | D | E | F | G | H | I | J | K | D-FAILURE | U-FAILURE |
| TEST PATTERN 1 | ADDRESS 1 | - | - | - | - | - | - | - | - | - | - | - | - | - |
| | ADDRESS 2 | - | - | - | - | - | U | - | U | - | - | - | 0 | 2 |
| | ADDRESS 3 | - | - | - | - | - | - | - | - | - | - | - | - | - |
| | ADDRESS 4 | - | - | - | - | - | - | - | - | - | - | - | - | - |
| | ADDRESS 5 | - | - | - | - | - | U | - | D | - | - | - | 1 | 1 |

← U-NODE (DEPTH "3")

| NODE NUMBER | ADDRESS | DEPTH OF TREE | D-CANDIDATE TABLE | U-CANDIDATE TABLE |
|---|---|---|---|---|
| [0] | 1-4 | 0 | FIG.7A | FIG.7B |
| [1] | 1-5 | 1 | FIG.8A | FIG.8B |
| [3] | 1-1 | 2 |  | FIG.9A |
| [7] | 1-3 | 3 |  |  |
| [4] | 1-1 | 2 |  | FIG.9B |
| [8] | 1-3 | 3 |  |  |
| [2] | 1-1 | 1 | FIG.8C | FIG.8D |
| [5] | 1-2 | 2 |  |  |
| [6] | 1-3 | 2 |  | FIG.9C |
| [9] | 1-5 | 3 |  |  |

FIG. 11

SYSTEM AND METHOD FOR IDENTIFYING FAILURE CANDIDATES IN A SEMICONDUCTOR APPARATUS

CROSS-REFERENCE TO RELATED APPLICATIONS

This application claims priority from, and the benefit of, Japanese Patent Application No. 2004-142091, filed on May 12, 2004, the contents of which are expressly incorporated herein by reference in their entirety.

BACKGROUND OF THE INVENTION

A. Field of the Invention

The present invention relates to systems and methods for identifying failure candidates for a failure analysis in a semiconductor apparatus, and more particularly, to systems and methods for identifying failure candidates with reduced execution time and improving efficiencies for identifying failure candidates in a failure analysis of a semiconductor apparatus.

B. Description of the Related Art

Failure analysis of a semiconductor integrated circuit (IC) may include physical analysis for detecting failure candidates, which may become failure causes of the IC among a large number of circuit nodes and circuit elements used in the IC. Failure analysis is performed based on measurement results of a tester that is very expensive.

Generally, it is very difficult to execute physical analysis many times for detecting failure candidates of a plurality of causes or at a plurality of portions in the same failure sample. Accordingly, in advance of performing a physical analysis, a restricting operation may be performed for minimizing the numbers of failure candidates. Usually, the failure candidates identifying operation is performed by comparing a failure dictionary produced by executing a failure simulation with actual measured results from a test equipment.

However, the conventional methods are labor and time intensive for performing the failure candidates restricting operation. Nevertheless, the conventional method frequently fails to analyze failure causes due to difficulties in restricting the numbers of failure candidates.

Recent fining technologies of semiconductor manufacture have rapidly developed for large scale integration and complication of circuits installed in one chip. Accordingly, the analysis for identifying failure candidates requires much more labor and time. Moreover, it becomes much more difficult to perform a failure candidates identifying operation due to multiple layers of wiring and complication of circuits in an IC.

To solve these difficulties of failure analysis, Japanese Patent Application Publication 2000-155156 (herein '156) has proposed a method for restricting the number of failure causes. The method proposed to restrict the number compares output expectation values of a failure simulation with actual measured results by a test equipment at each of several times.

However, the method of '156 has serious problems; for example, it occupies expensive test equipment for performing a failure analysis for a long time. In particular, if a plurality of failure causes exists in a subject IC, measurements of test patterns may be repeated for every time by the test equipment with back tracking selection of a following test pattern. This occupies the test equipment for a longer time in order to execute the failure analysis. Since the proposed method of 1156 restricts the number by comparing output expectation values of a failure simulation, it is hard to apply other failure causes, such as the Iddq failure, which occurs from an abnormal increase of source current while the device is stopped. Thus, the proposed method of '156 still has many problems.

SUMMARY OF THE INVENTION

In one aspect, the present invention provides a failure candidates identifying system that comprises: a failure dictionary storing unit configured to store a failure dictionary that is generated by performing a failure simulation by supposing each of a plurality of failure modes against each of a plurality of input patterns; a searching tree generating unit configured to construct a failure candidate searching tree by using the failure dictionary stored in the failure dictionary storing unit; a test vector generating unit configured to generate test vectors for measuring a semiconductor apparatus based on the failure candidate searching tree, the test vectors are supplied to a test equipment and measured for providing fail logs as a result of the measurement; a failure candidates searching unit configured to restrict failure candidates by using the failure candidates searching tree and the fail logs; and a display unit configured to display the restricted failure modes.

According to an embodiment of a semiconductor apparatus, a failure candidates identifying system for extracting a failure mode is provided. The failure mode may become a possible failure cause for a semiconductor apparatus by comparing a failure dictionary produced by a failure simulation with a fail log obtained by test equipment measurement. The failure candidates identifying system comprises: a failure candidates searching tree configured to set input patterns selected from the failure dictionary as nodes of a tree structure, an input pattern in the failure candidates searching tree does not exist with overlapping in a route starting from a root node of the nodes; a searching tree generating unit configured to set as a child node of the node by selecting an input pattern of the smallest absolute value of a difference between a detect failure number at the observed failure mode and an un-detect failure number from the failure dictionary by observing a Detect failure or an un-detected failure at the input pattern of the node in the event that the node has a child node; and a failure candidates searching unit configured to extract the failure candidates by searching a D-node being set as the child node with observing the un-detect failure based on a fail data indicating "Pass" or "Fail" among the fail logs when the fail data is "Fail" and by searching a U-node being set as the child node with observing the detect failure without searching the D-node when the fail data is "Pass".

According to another embodiment, a failure candidates identifying method is provided that may become a possible failure cause for a semiconductor apparatus by comparing a failure dictionary produced by a failure simulation with a fail log obtained by test equipment measurement. The failure candidates identifying method comprises: constructing a failure candidates searching tree of a tree construction by observing a Detect failure or an un-detected failure at an input pattern of a node in the event that input patterns selected from the failure dictionary have a child node, and setting an input pattern of the smallest absolute value of a difference between a detect failure number at the observed failure mode and an un-detect failure number from the failure dictionary the child node of the node by selecting from the failure dictionary; and failure candidates searching to extract the failure candidates by searching a D-node being set as the child node with observing the un-detect failure based on fail data indicating "Pass" or "Fail" among the fail logs when the fail data is "Fail" and by searching a U-node being set as the child node with observing the detect failure without searching the D-node when the fail data is "Pass".

BRIEF DESCRIPTION OF THE DRAWINGS

The accompanying drawings, which are incorporated in and constitute part of this specification, illustrate various embodiments and/or features of the present invention, and together with the description, serve to explain the present invention. Where possible, the same reference numbers are used throughout the drawings to describe the same or like parts.

FIG. 5 is a table showing route data of failure candidates in the failure candidates identifying system of FIG. 1.

FIG. 7-A is an exemplary image of a D-candidate table of a root node used in the failure candidates identifying method.

FIG. 7-B is an exemplary image of a U-candidate table of a root node used in the failure candidates identifying method.

FIGS. 8-A, 8-B, 8-C and 8-D are exemplary images of a candidate tables of a node at a depth "2" in the failure candidates identifying method.

FIGS. 9-A, 9-B and 9-C are exemplary images of a candidate tables of a node at a depth "3" in the failure candidates identifying method.

FIG. 11 shows an exemplary table of a failure candidate searching tree constructed from the failure dictionary depicted in FIG. 2.

DESCRIPTION OF THE EMBODIMENTS

Figure 1:
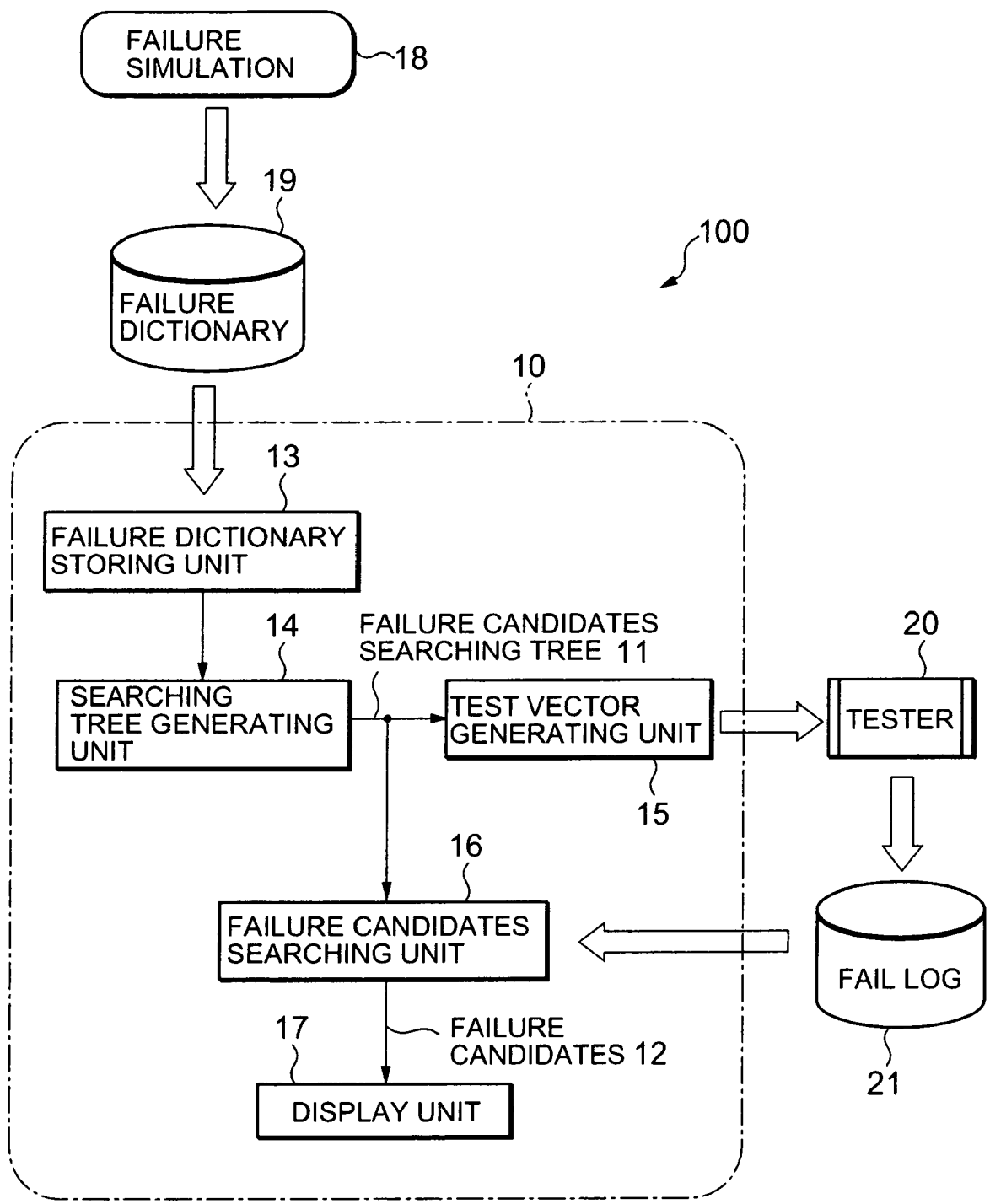
FIG. 1 is a block diagram illustrating an embodiment of a failure candidates identifying system.

Reference will now be made in detail to the exemplary embodiments consistent with the inventions, examples of which are illustrated in the accompanying drawings. FIG. 1 is a block diagram of a failure candidates identifying system 100. Failure candidates identifying system 100 comprises a failure simulation 18, a failure dictionary 19 generated by the failure simulation 18, a failure candidates identifying unit 10, a tester 20 and a fail log 21. In particular, as explained later, the failure candidate identifying unit 10 constructs a failure candidates searching tree 11 and executes a particular operation of narrowing down or restricting of failure candidates by using the constructed failure candidates searching tree 11.

As depicted in FIG. 1, the failure candidates identifying unit 10 includes a failure dictionary storing unit 13 configured to store the failure dictionary 19 that was generated by performing failure simulation 18, a searching tree generating unit 14 configured to construct a failure candidates searching tree 11 by using the failure dictionary stored in the failure dictionary storing unit 13, a test vector generating unit 15, a failure candidates searching unit 16 configured to generate failure candidates 12, and a display unit 17.

The failure dictionary 19 stored in the failure dictionary storing unit 13 is generated by performing failure simulation 18 by supposing failure modes against each of the input patterns. The supposed failure modes are listed as a table. The list table includes Detect failures (hereinafter referred to as "D-failures") and Un-detect failures (hereinafter referred to as "U-failures") depending upon each result of the failure simulation. Thus, failure dictionary storing unit 13 stores the list table of D-failures and U-failures.

By using the failure dictionary 19 stored in the failure dictionary storing unit 13, the searching tree generating unit 14 generates a failure candidate searching tree 11. As explained above, the failure candidate searching tree 11 identifies failure candidates 12. Thus, the constructed failure candidates searching tree 11 is supplied to both the test vector generating unit 15 and the failure candidates searching unit 16.

Based on the failure candidate searching tree 11, the test vector generating unit 15 generates test vectors for measuring an object semiconductor apparatus for an analysis (hereinafter referred to as an "analyzing object"). Results of the measuring of the analyzing object by the tester 20 are provided as the fail log 21.

Both of the fail log 21 and the failure candidate searching tree 111 from the searching tree are supplied to the failure candidates searching unit 16. Thus, the failure candidates searching unit 16 executes an operation of restricting or narrowing down of failure modes, based on the received fail log 21 and the failure candidates searching tree 11. The restricted failure modes are displayed on the display unit 17 as the failure candidates 12. The displayed failure candidates 12 may be supplied to other terminal equipment.

Figure 2:
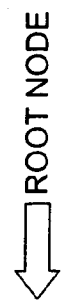
FIG. 2 depicts an exemplary image of a failure dictionary used in the failure candidates identifying system of FIG. 1.

FIG. 2 is an exemplary image of the failure dictionary 19 stored in the failure dictionary storing unit 13 for use in the failure candidates identifying unit 10. A test pattern 1 indicates an input pattern supplied to the analyzing object. The test pattern 1 comprises a plurality of addresses. FIG. 2 shows that the test pattern 1, as an example, comprises five addresses 1-5. Each address is a combination of logical values having no variation over time.

Further the failure dictionary 19 in the failure dictionary storing unit 13 comprises eleven failure modes A-K; each is a result of simulation on each of the failure modes A-K, and failure mode numbers of D-failures and U-failures. In this table, a character "D" represents "D-failure" as a result of simulation. A character "U" represents "U-failure" as a result of simulation. In this specification, sometimes, D-failures and U-failures are referred to in total as "failure data". A failure mode is a combination of a failure portion and failure statuses. The failure statuses, for example, include a zero (0) fixed failure and a one (1) fixed failure.

D-failure means that a failure mode can be detected at each address, e.g., at each input pattern as shown in FIG. 2. If the failure mode actually exists in the analyzing object, a measured result by the tester 20 against the input pattern becomes "Fail". U-failure means that a failure mode cannot be detected at each of the addresses, e.g., at each input pattern. Even if the failure mode actually exists in the analyzing object, a measured result by the tester 20 against the input pattern becomes "Pass". For instance, in FIG. 2, the eleven failure modes at the address 1 of test pattern 1 ("address 1-1") includes four failure modes A-D are D-failures and the remaining seven failure modes E-K are U-failures.

It should be noted that a U-failure does not deny existence of a failure mode. Thus, even if a failure mode becomes a U-failure at a certain input pattern, there still remains a possibility that the failure mode becomes a D-failure at another input pattern. Accordingly, it is desirable to execute as many combinations of addresses against a subject failure mode, as possible in the actual failure simulation.

As shown in FIG. 2, in the list of the failure mode numbers, both numbers of the failure mode that becomes D-failure and numbers of the failure mode that becomes U-failure at each address. An arrow indicating a particular address is affixed so as to indicate that the address becomes a root node of failure candidate searching tree 11. Thus, in this exemplary case, the address 1-4 is selected as the root node of failure candidate searching tree 11.

Figure 3:
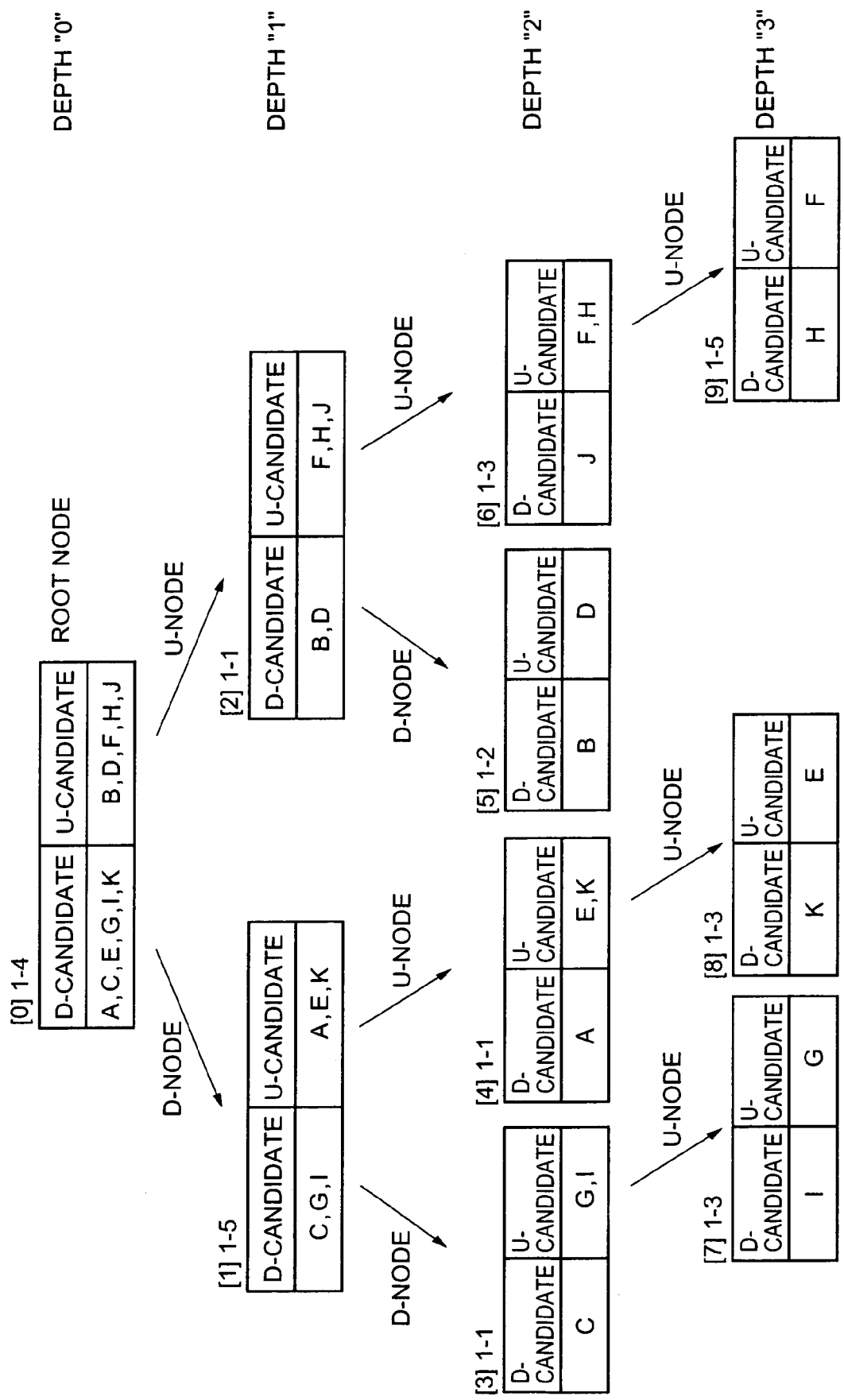
FIG. 3 illustrates an example of a failure candidate searching tree used in the failure candidates identifying system of FIG. 1.

FIG. 3 is an exemplary image of the failure candidates searching tree 11 that is used in the failure candidates identifying unit 10. As mentioned above, the failure candidates searching tree 11 is used for identifying failure candidates based on the failure dictionary.

The failure candidates searching tree 11 has a two forked tree construction including one root node of a depth "0", two child nodes of a depth "1", four grandchild nodes of a depth "2" and three great-grandchild nodes of a depth "3". Each node has two child nodes that are selected based on the failure mode of a D-failure (hereinafter referred to as a "D-candidate") and the failure mode of a U-failure (hereinafter referred to as a "U-candidate"). The child node that is selected based on the D-candidate is referred to as a "D-node", and the child node that is selected based on the U-candidate is referred to as a "U-node".

A combination of a D-candidate and a U-candidate for a D-node becomes the same as a D-candidate of a parent node. Thus, the combination of D-candidate and U-candidate for D-node is referred as an "observed candidate" for the D-node. Similarly, the observed candidate of a U-node becomes the same as a U-candidate of a parent node.

The failure candidate searching tree 11 is also a tree of an order. Thus, a D-node is an elder brother node and a U-node is a younger brother node. In FIG. 3, a D-node is shown at a left-hand, and a U-node is shown at a right-hand. Each of numbers [0]-[9] affixed at a left-hand top on each of nodes represents a node number, respectively. Each of numbers 1-4, 1-5, 1-1, 1-2, 1-3 that is affixed at a side of each node number represents an address shown in the table of FIG. 2.

If a node has only one D-candidate or U-candidate, the node has no corresponding child node. For example, in FIG. 3, the node "[3] 1-1" does not have a D-node because this node has only D-candidate of failure C. Further, even if a plurality of observed candidates exists, its child node does not necessarily exist. Such a node is not shown in FIG. 3.

Figure 4:
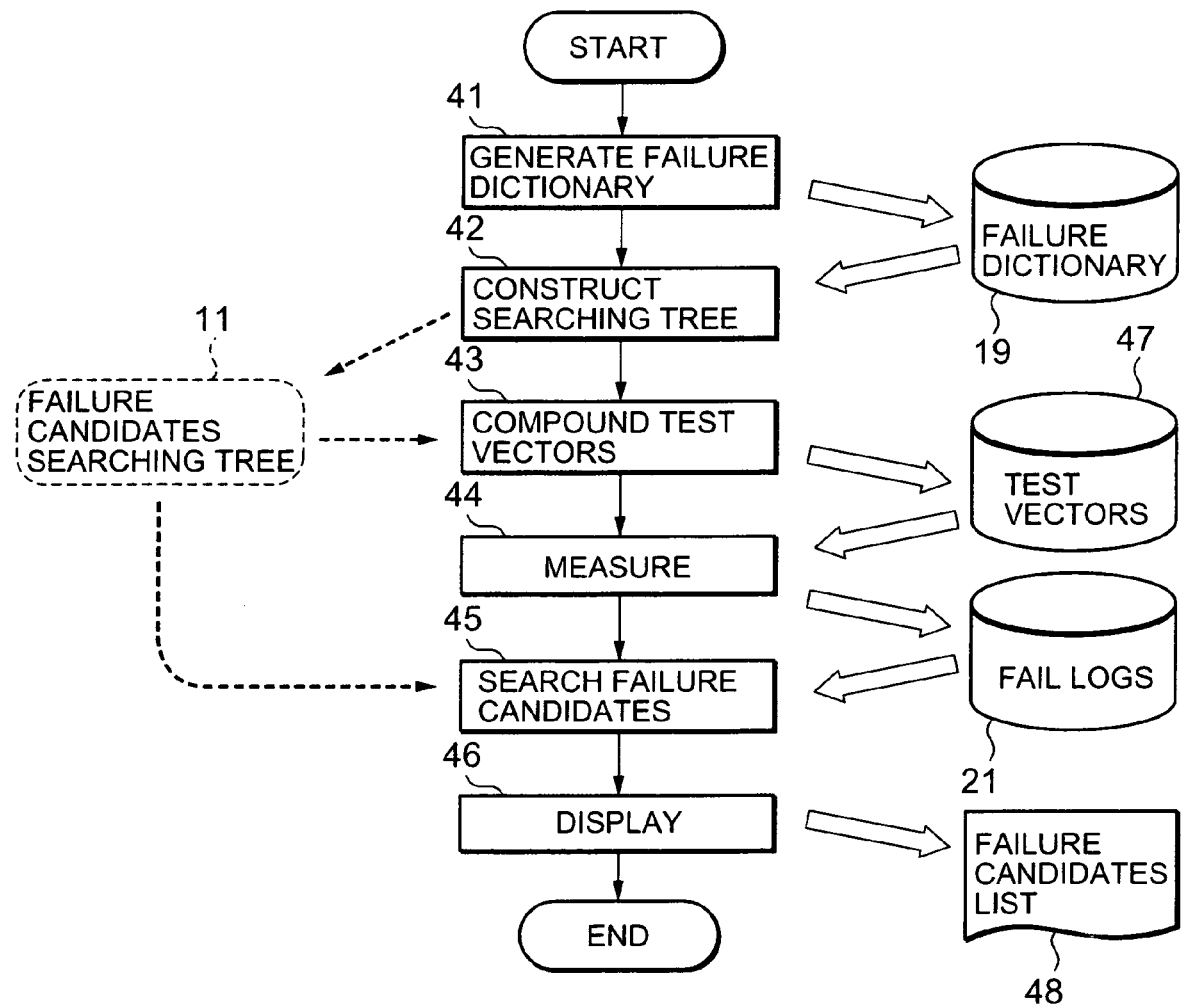
FIG. 4 is a flow chart explaining a method for identifying failure candidates of the failure candidates identifying system of FIG. 1.

FIG. 4 is a flowchart illustrating a method for identifying failure candidates of the above-mentioned configuration of the system 100. The failure candidates identifying method includes a failure dictionary producing step 41, a searching tree constructing step 42, a test vector compounding step 43, a measuring step 44, a failure candidates searching step 45 and a displaying step 46.

First, at the failure dictionary producing step 41, a plurality of combinations of addresses against a detecting failure mode is simulated as much as possible through a failure simulation. Next, a failure dictionary 19, such as shown in FIG. 2, is produced by judging whether each failure mode for the respective address is a D-failure or a U-failure. The produced failure dictionary 19 is stored in a failure dictionary storing unit 13 of the failure candidates identifying unit 10 (FIG. 1). A judging reference used for judging either a D-failure or a U-failure is further used for comparing expected values of output and also for detecting abnormal current, such as a variation of current value of an analyzing subject.

At the searching tree constructing step 42, the searching tree generating unit 14 of the failure candidates identifying unit 10 (FIG. 1) reads the failure dictionary 19 and constructs a failure candidates searching tree of two forked tree structure as depicted in FIG. 3. A tree constructing method will be explained later. The constructed failure candidates searching tree 11 is supplied to both the test vector generating unit 15 and the failure candidates searching unit 16 of the failure candidates identifying unit 10 (FIG. 1) as internal data.

At the test vector compounding step 43, test vector compounds a test vector 47 based on the received failure candidates searching tree 11 in the generating unit 15. The test vector 47 is outputted to the tester 20 for actually executing a measurement. The actually generated test vector 47 is all addresses used in the failure candidate searching tree 11. The addresses are arranged in time series without overlapping. For instance, although the address 1-1 appears three times as nodes [2], [3] and [4] in the failure candidates searching tree in FIG. 3, the measurement by the tester 20 is done only one time. Other nodes are processed similarly. Thus, the test vector 47 compounded from the failure candidate searching tree 11 of FIG. 3 becomes the same as the test pattern 1 of FIG. 2 without ordering of addresses.

At measuring step 44, an examining semiconductor apparatus is measured through the tester 20 by using the test vector 47 that is compounded at test vector compounding step 43. Measurement results are outputted as a fail log 21. At failure candidates searching step 45, failure candidates searching unit 16 (FIG. 1) narrows down the failure modes based on the fail log 21 and the failure candidates searching tree 11 in accordance with a tree searching method that will be explained later. Then, an extracted failure mode is outputted to the displaying unit 17 as a failure candidate 12.

At displaying step 46, the displaying unit 17 displays the received failure candidates 12 together with its route data as a failure candidates list 48. The route data shows a path from a searched root node on the failure candidates searching tree 11 in order to specify its failure mode. In the failure candidates list 48, a node number, an address and a measuring result by the tester 20 are displayed in order of depth of the tree. Hereinafter, measuring results for the respective address are referred to as "Fail data".

FIG. 5 is a table showing route data of failure candidates in the failure candidates identifying system 100. As an exemplary case, FIG. 5 shows route data in the failure candidate searching tree 11 of FIG. 3 for the failures A-K of FIG. 2. For example, failure mode A is extracted as a failure candidate 12 and displayed when the fail data is "Fail" at the address 1-4, fail data is "Pass" at the address 1-5 and fail data is "Fail" at the address 1-1. Judging criteria for deciding "Pass" or "Fail" as the measuring results is similar to the judging criteria for judging a D-failure or U-failure in the failure simulation 18 at the failure dictionary producing step 41. Although FIG. 5 shows the route data for all failure modes, in failure candidates list 48, failure candidates 12 may be restricted to the failures A-K based on the measuring results (Fail log 21) at the measuring step 44. Then the restricted failure candidates are displayed.

Figure 6A:
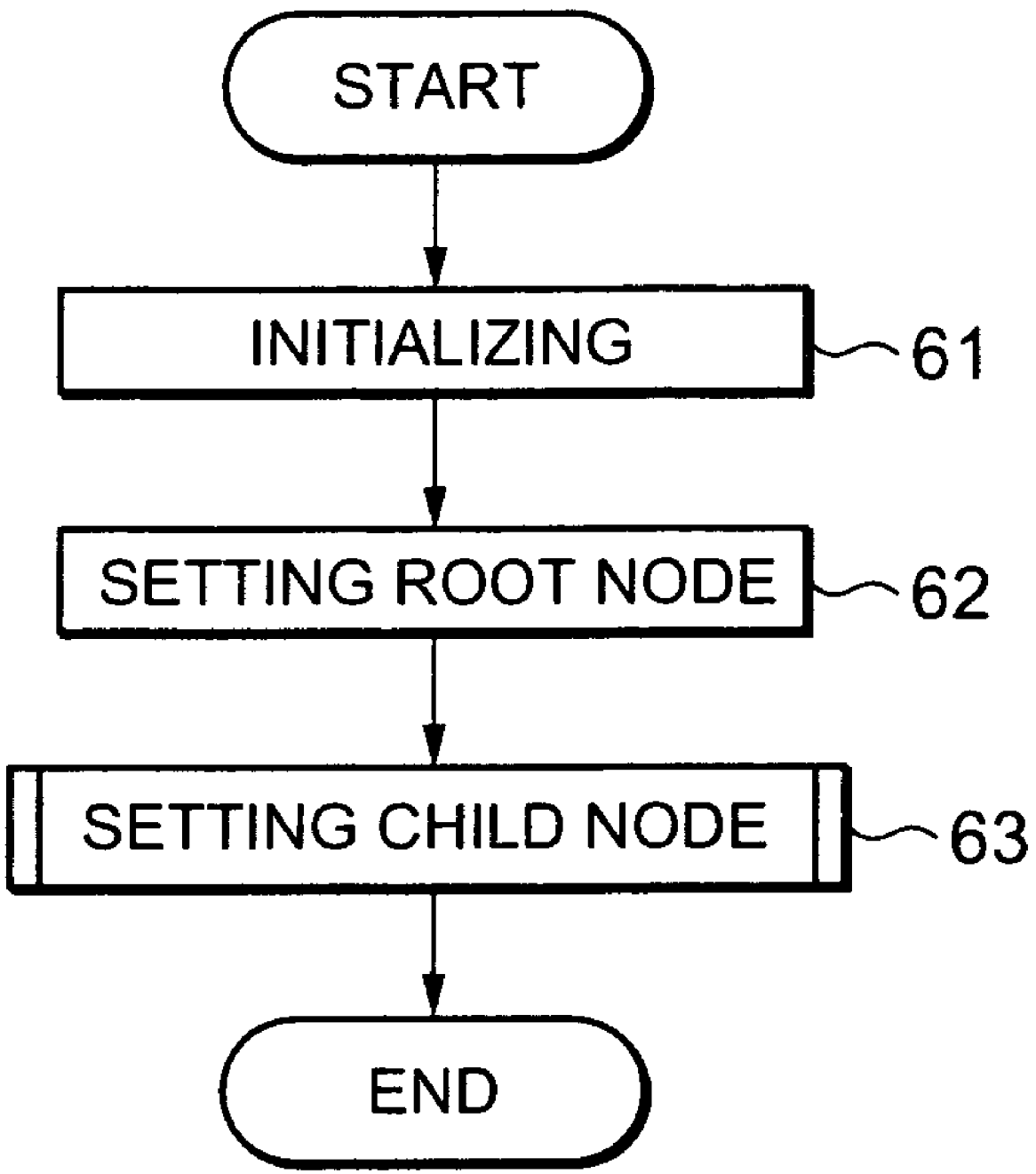
FIGS. 6-A and 6-B are flow charts showing a method for constructing a failure candidates searching tree used in a failure candidates identifying method.
Figure 6B:
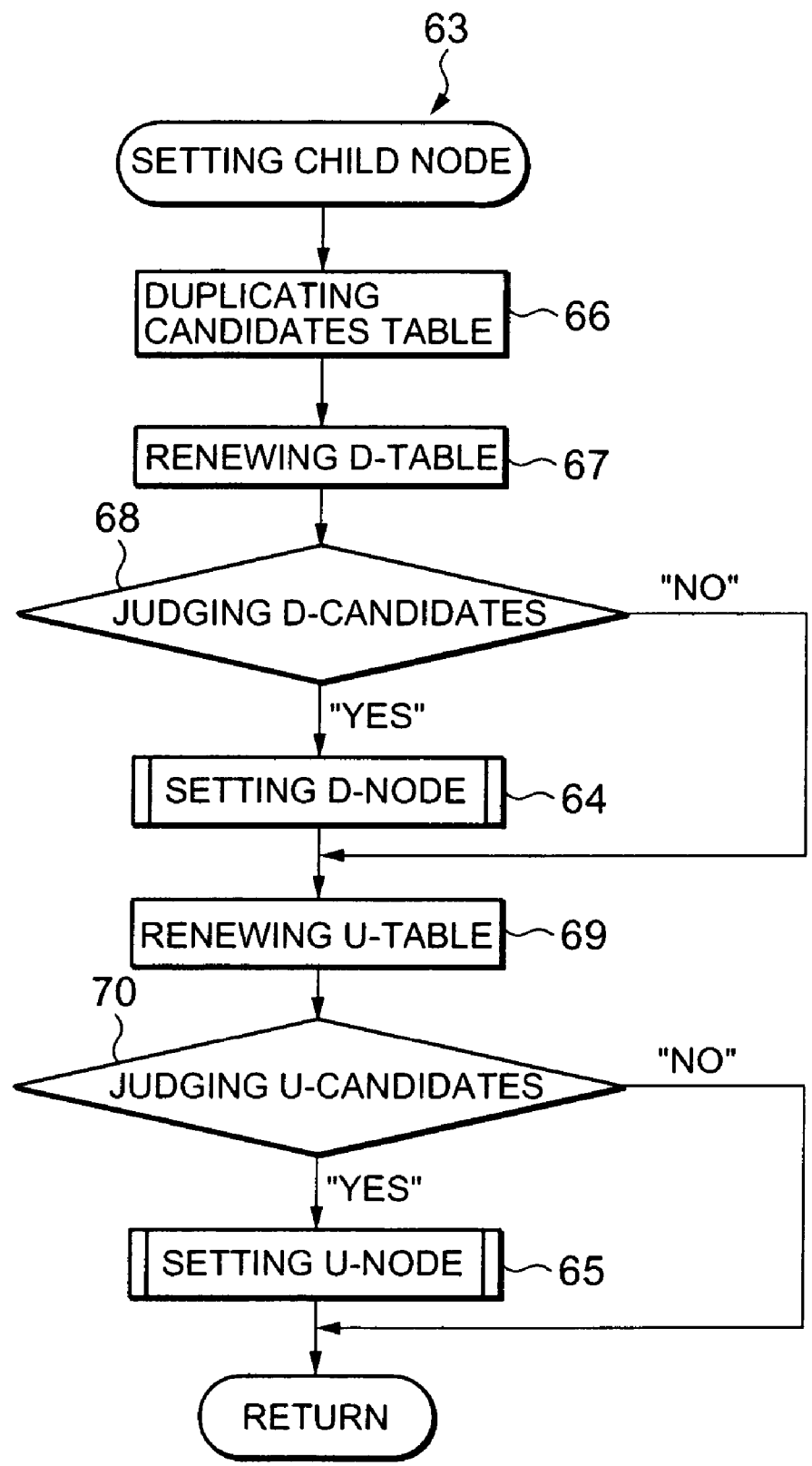

FIGS. 6-A and 6-B are flowcharts showing a method for constructing the failure candidate searching tree 11 in the searching tree constructing step 42. To simplify the explanation of the tree constructing method, FIGS. 6-A and 6-B show a recurrent operation flow that uses a self-reading routine. As shown in FIG. 6-A, the tree constructing method in the failure candidates identifying method comprises an initializing step 61, a root node setting step 62 and a child node setting step 63.

At the initializing step 61, the searching tree generating unit 14 duplicates the failure dictionary 19 to the route table. The produced route table is transferred to the child node setting step 63 as an argument. At the root node setting step 62, the searching tree generating unit 14 selects one address for designating as a root node in the route table based on a number of failure mode of the route table and sets it to the root, e.g., depth "0", of the failure candidate searching tree 11. The root node is arbitrarily selected from the address for which the absolute value of the difference between a D-failure number and a U-failure number is the smallest. For example, in the case of the failure dictionary 19 in FIG. 2, as indicated by an arrow, the D-failure number "6" and the U-failure number "5" of the address 1-4 are selected and are set as a root node of the failure candidates searching tree 11 of FIG. 3.

At the child node setting step, the searching tree generating unit 14 selects a D-node and a U-node based on an observed candidate of the root node and set them as a child node of depth "1". The child node setting steps 63 is a recurrent step that calls itself during the flow and set up a further child node. By doing this, a failure candidate searching tree 11 having a two forked tree structure is constructed. By completing the failure candidate searching tree 11, the searching tree generating unit 14 outputs it to the test vector generating unit 15 and the failure candidates searching unit 16. And the searching tree constructing step 42 (FIG. 4) is completed.

FIG. 6-B explains a detail flow of the child node setting step 63. The child node setting steps 63 includes a D-child node setting step 64 for recurrently calling up itself, a U-child node setting step 65, a candidate table duplicating step 66, a D-table renewing step 67, a D-candidate judging step 68, a U-table renewing step 69 and a U-candidate judging step 70. First, at the candidate table duplicating step 66, the searching tree generating unit 14 duplicates the received route table that is transferred as an argument, and produces two candidate tables of a D-candidate table and a U-candidate table. A D-candidate table is used for selecting a D-node. A U-candidate table is used for selecting a U-node.

At the D-table renewing step 67, the searching tree generating unit 14 renews the D-candidate table after observing the D-candidate of the root node. For example, in the case of FIG. 2, the D-failure at the addresses 1-4, that is, failures A, C, E, G, I and K, are the D-candidate of the root node. To renew the D-candidate table, the data of the root node is firstly deleted from the D-candidate table produced at the candidate table duplicating step 66. Next, only failure data corresponding D-candidate of the root node are left.

FIGS. 7-A and 7B are exemplary images of a renewed D-candidate table and a U-candidate table, respectively, of the root node in the failure candidates searching tree 11 of FIG. 3. Numbers shown at an upper left side of each table represent a node number and an address corresponding to FIG. 3. In FIGS. 7-A and 7-B, data deleted from the route table are represented by "–" in order to indicate the table renewing statuses. For instance, as shown in FIG. 7-A, in the D-candidate table of the root node in FIG. 3, all data of addresses 1-4, and failure data corresponding to the U-candidate failures B, D, F, H and J are deleted. A number of failure modes of the D-candidate table are renewed to the D-failure number and U-failure number of failure data corresponding to the D-candidate. For instance, at the address 1-1 in FIG. 7-A, the D-failure number becomes "2" and the U-failure number becomes "4".

At D candidate judging step 68 in FIG. 6-B, the searching tree generating unit 14 judges the existence of a D-node based on the renewed D-candidate table at the D table renewing step 67. A selection criterion for the D-node is similar to one of the root node selection at the route table. Thus, one absolute value of a difference between the D-failure number and the U-failure number is selected among the smallest addresses, excepting addresses of which D-failure number or U-failure number is zero ("0"). If the D-failure number or U-failure number is zero for all addresses remaining in the D-candidate table, the D-node is not selected.

If the existence of a D-node is "Yes", the searching tree generating unit 14 goes to D-child node setting step 64 for reading up a child node setting step 63 in FIG. 6-A based on D-candidate table as an argument. If the existence of a D-node is "No", the searching tree generating unit goes to U-table renewing step 69 by skipping D-child node setting step 64. For example, in a case of FIG. 7-A, addresses 1-5, in which the D-failure number is equal to the U-failure number, are selected and a D-node of depth "1" is set as a node number [1], as shown in FIG. 3.

D-child node setting step 64 in FIG. 6-B is a recurrent step for calling up child node setting step 63 as the renewed D-candidate table in the D-table renewing step 67 as an argument, and sets each child D-node of node failure candidate searching tree 11. By using such a recurrent flow, it is possible to naturally realize the D-node setting at a tree construction and back tracking to a parent node.

For example, in a practical case of node [0] in FIG. 3, child node setting step 63 calls up D-candidate table shown in FIG. 7-A as an argument and sets the addresses 1-5 that are selected at D-candidate judging step 68 as a D-node. In the called up child node setting step 63, descendant nodes below node [1], e.g., nodes [1], [3], [4], [7] and [8], are set by recurrently calling up a further child node setting step 63 with recurrently calling up a U-child node setting step 65 that is explained later.

When D-node setting is completed, searching tree generating unit 14 renews the U-candidate table by observing a U-candidate of the root node at U-table renewing step 69. For example, in case of FIG. 2, U failures of the address 1-4, e.g., failures B, D, F, H and J, are U-candidates of the root node. Renewing of the U-candidate table is performed similar to the renewing of the explained D-candidate table. For example, in the U-candidate table at the root node in FIG. 3, as shown in FIG. 7-A, all data addresses 1-4 and failure data in D-candidate corresponding to failures A, C, E, G, I and K are deleted. The failure mode number of the U-candidate table is renewed to the D-failure number and the U-failure number of failure data corresponding to the U-candidate. For instance, in a case of address 1-1 in FIG. 7-B, the D-failure number becomes "2" and the U-failure number becomes "3".

At the next U-candidate judging step 70, searching tree generating unit 14 judges whether the U-node exists or not based on the renewed U-candidate table at U-table renewing step 69. The selection criteria for the U-node are similar to the root node selection at the route table. That is, one absolute value of a difference between the D-failure number and U-failure number is selected among the smallest addresses, excepting addresses of which the D-failure number or the U-failure number is zero ("0"). If the D-failure number or the U-failure number is zero for all addresses remaining in the D-candidate table, the D-node is not selected.

If a U-node exists, e.g., "Yes", searching tree generating unit 14 goes to U-child node setting step 65 for calling up child node setting step 63 as using U-candidate table as an argument. If a U-node does not exist, e.g., "No", searching tree generating unit 14 finishes child node setting step 63 with skipping over U-child node setting step 65. In the case of FIG. 7-B, address 1-1 of which absolute value of a difference between the D-failure number and the U-failure number is "1" is selected and is set as a U-node of depth "1" (node number [2]) as shown in FIG. 3.

U-child node setting step 65 is also a recurrent step similar to the above-explained D-child node setting step 64. Child node setting step 63 is called up by using U-candidate table as an argument and U-node of a child node is set at each of nodes of failure candidates searching tree 11. Practically, in a case of the node [0], for instance, the child node setting step 63 is called up by using the U-candidate table shown in FIG. 7-B as an argument, and the selected address 1-1 at the U-candidate judging step 70 is set as a U-node.

Similar to the D-child node setting step 64, descendant nodes below the node [2], e.g., nodes [5], [6] and [9], are set by recurrently calling up the child node setting step 63 at the U-child node setting step 65. FIG. 11 shows an exemplary case of the failure candidate searching tree 11 shown in FIG. 3 as constructed from the failure dictionary 19 shown in FIG. 2 in accordance with the above-explained tree constructing flow. The constructed tree is represented in order of nodes.

FIGS. 8-A, 8-B, 8-C, 8-D and FIGS. 9-A, 9-B, 9-C depict exemplary images of candidate tables of a method for identifying failure candidates. FIGS. 8-A, 8-B, 8-C, and 8-D show a candidate table of each node in a depth "1" of the tree. FIGS. 9-A, 9-B and 9-C show candidate tables in a depth "2" of the tree. Similarly to the candidate tables shown in FIG. 7-A and 7-B, these candidate tables are renewed at the D-table renewing step 67 or U-table renewing step 69 and used in the D-candidate judging step 68 or U-candidate judging step 70.

It should be noted that if a route from a root node is different, while the candidate table relates to the same address, e.g., the same node number, the observed candidate is different and the candidate table is also different. For example, while both FIG. 8-D and FIG. 9-A are the U-candidate tables for the address 1-1, they are different U-candidate tables since each of the node numbers are different. In FIGS. 9-A, 9-B, 9-C and FIG. 11, candidate tables are not shown when a child node is not set.

Figure 10A:
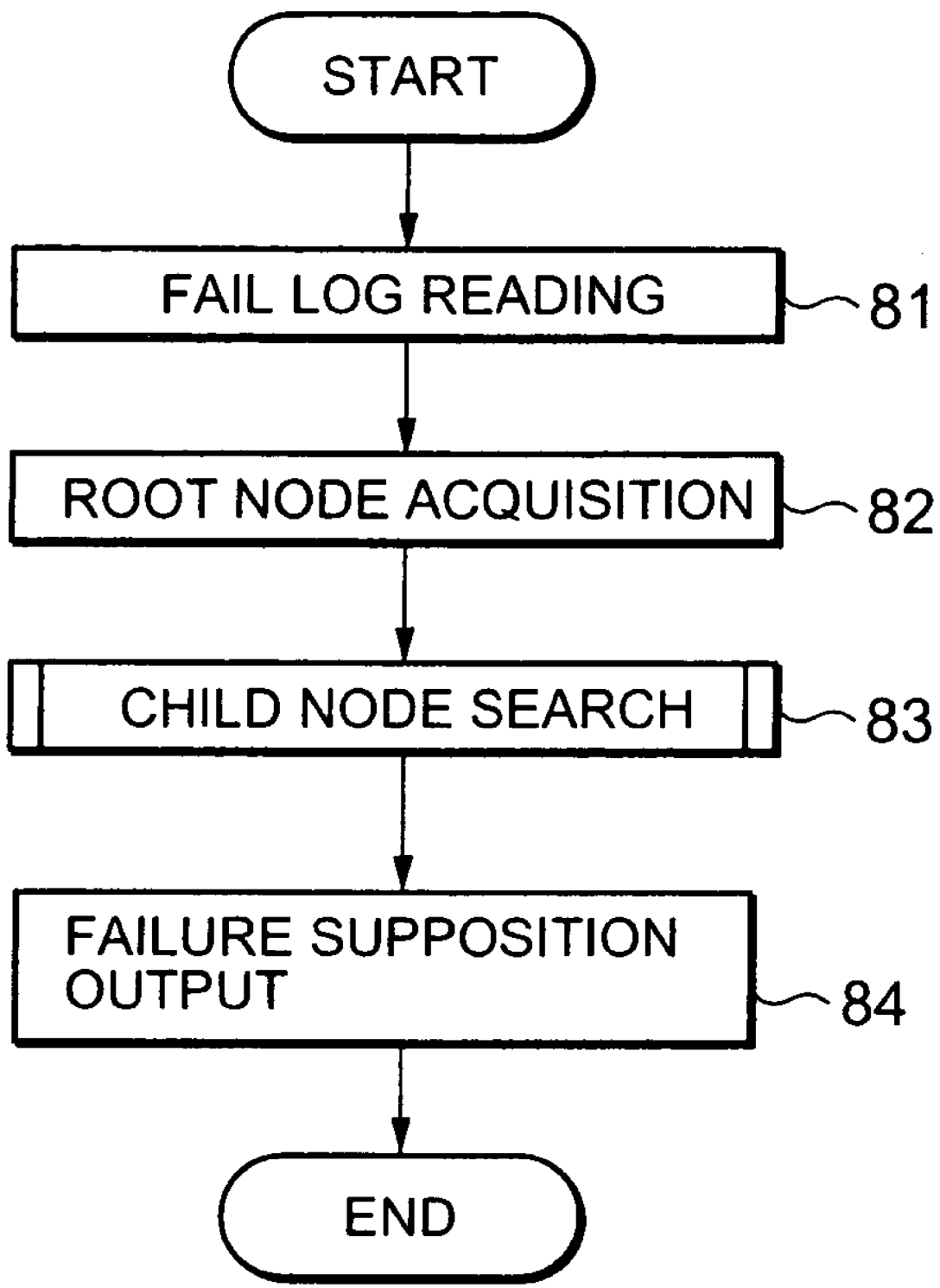
FIGS. 10-A and 10-B are flow charts explaining a searching method of a failure candidates searching tree used in the failure candidates identifying method.
Figure 10B:
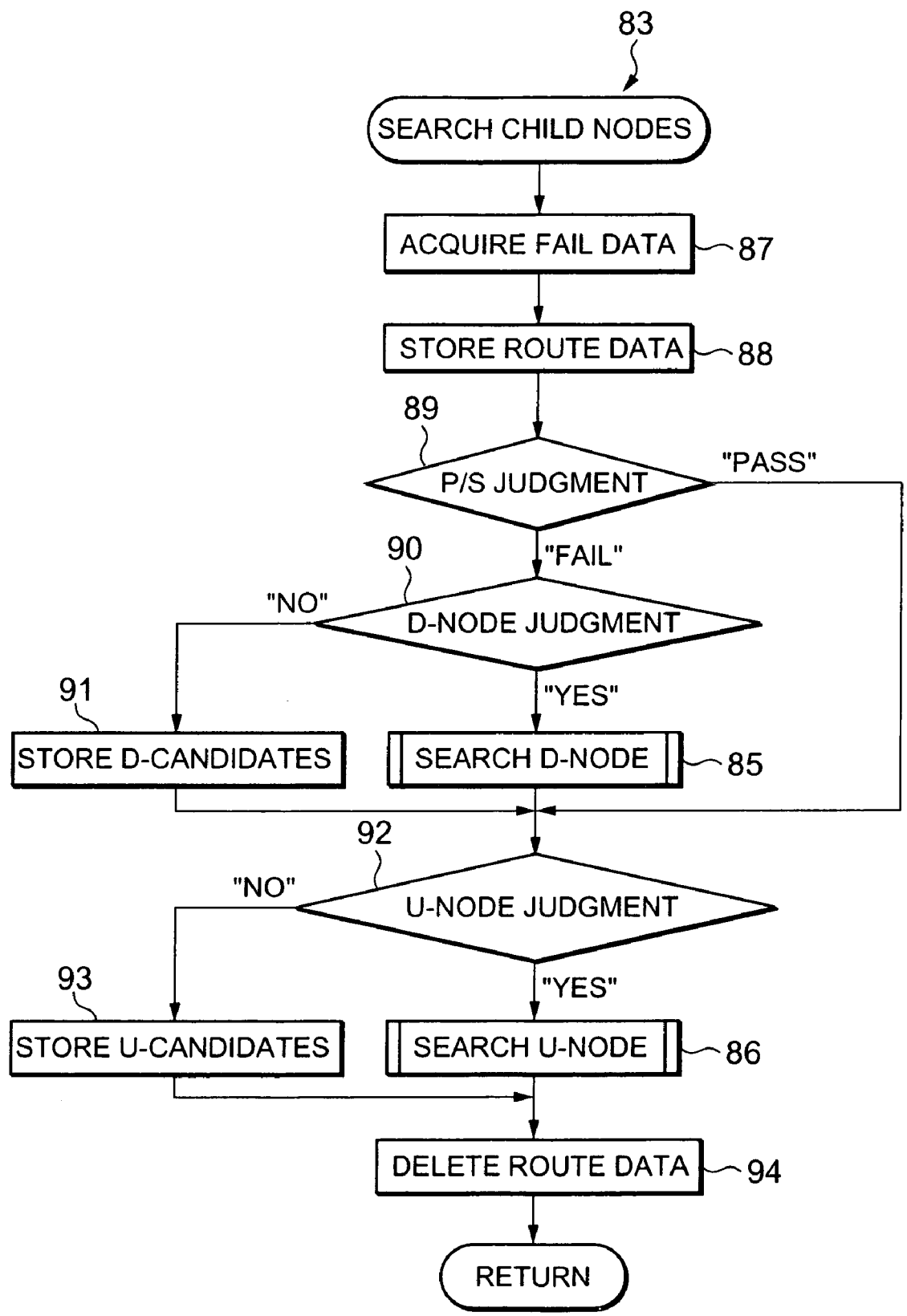

With reference to FIGS. 10-A and 10-B, a method for searching the failure candidates searching tree 11 (referred to as a tree searching method) at the failure candidates searching step 45 will be explained. Similar to FIGS. 6-A and 6-B, FIGS. 10-A and 10-B show recurrent operation flows. As illustrated in FIG. 10-A, the tree searching method in the failure candidates identifying method includes a fail log reading step 81, a root node acquisition step 82, a child node search step 83 and a failure candidates output step 84.

First, the failure candidates searching unit 16 (FIG. 1) reads a fail log 21 (FIG. 1) being outputted from the tester 20 (FIG. 1) at the fail log reading step 81 and produces a fail table comprised of an address and a fail data thereof. Next, the failure candidates searching unit 16 acquires a root node from the failure candidates searching tree 11 constructed by the searching tree generating unit 14 at the root node acquisition step 82. The acquired root node is transferred as an argument at a calling up at the child node searching step 83.

Then, at the child node searching step 83, the failure candidates searching unit 16 searches the failure candidates searching tree 11 starting from the acquired root node based on the fail table produced at the fail log reading step 81, and the failure candidates 12 is narrowed down. The child node searching step 83 is a recurrent step similar to the child node setting step 63 in the above-explained tree construction method. When the child node searching step 83 is called up, a processing node is transferred as an argument.

When the child node searching is completed, at the failure candidates output step 84, the failure candidates searching unit 16 outputs the failure candidates 12 narrowed down at the child node searching step 83 and the corresponding root data, and then the failure candidates searching step 45 finishes.

FIG. 10-B is a flow chart explaining the child node searching step 83. The child node searching step 83 includes a D-node searching step 85 that recurrently calls up the child node searching step 83, a U-node searching step 86, a fail data acquisition step 87, a route data memorizing step 88, a P/S judging step 89, a D-node determining step 90, a D-candidate memorizing step 91, a U-node determining step 92, a U-candidate memorizing step 93 and a route data omitting step 94. At the fail data acquiring step 87, the failure candidates searching unit 16 acquires a fail data of a node that was transferred as an argument produced at the fail log reading step 81.

Next, at the route data memorizing step 88, the failure candidates searching unit 16 temporarily memorizes the node number, the address and the acquired fail data in a stack. Then, the failure candidate searching unit 16 judges whether the fail data of the node is a "Pass" or a "Fail" at the P/S judging step 89. If the fail data is a "Fail", the failure candidates searching unit 16 goes to the D-node determining step 90, since "Fail" indicates that a failure candidates 12 exists in the D-candidate of the node. If the fail data is a "Pass", the failure candidates searching unit 16 goes to the U-node determining step 92 without executing the D-node searching, since "Pass" indicates that a failure candidates 12 does not exist in the D-candidate of the node. It should be noted that "Fail" does not necessary mean the non-existence of a failure candidates 12 in the U-candidate. Consequently, in case of a "Fail", the failure candidates searching unit 16 executes a further searching of the U-node after finishing a search for a D-node.

The failure candidate searching unit 16 judges whether a D-node exists in the node at the D-node determining step 90. If the D-node exists, e.g., "Yes", the unit 16 goes to the D-node searching step 85 for recurrently calling up the child node searching step 83 by using the D-node as an argument. If a D-node does not exist, e.g., "No", the failure candidates searching unit 16 goes to the D-candidate memorizing step 91 in order to store its D-candidate as a failure candidates 12.

At the D-candidate memorizing step 91, the failure candidates searching unit 16 temporarily memorizes the D-candidate of the node with stacked root data in order to output as a failure candidates 12 at the failure candidates output step 84 to the displaying unit 17. When the D-node searching step 85 or the D-candidate memorizing step 91 has finished, the failure candidates searching unit 16 goes to the U-node determining step 92 in order to execute a search for a U-node. At the U-node determining step 92, the failure candidate searching unit 16 judges whether a U-node exists in the node. If a U-node exists, e.g., "Yes", it goes to the U-node searching step 86 for recurrently calling up. If a U-node does not exist, e.g., "No", the failure candidates searching unit 16 goes to the U-candidate memorizing step 93 in order to memorize its U-candidate as a failure candidates 12.

As explained above, a "Fail" does not mean that failure candidates 12 does not necessary exist in U-candidate. Consequently, a U-candidate may become a failure candidate 12 while a fail data is a "Fail" at a node that has not a child node, such as, for example, the node number [5] in FIG. 3. But, it also should be noted that if all of ancestor nodes are U-node, such as, for example, the U-candidate at the node number [9] in FIG. 3, the U-candidate is not always a failure cause.

At the U-candidate memorizing step 93, the failure candidates searching unit 16 temporarily memorizes the U-candidates of the nodes with the stacked root data in order to output them to the displaying unit as the failure candidates 12 at the failure candidates output step 84. When the U-node searching step 86 or the U-candidate memorizing step 93 has finished, the failure candidates searching unit 16 eliminates the root data of the stacked present nodes at the root data eliminating step 94 and finishes the child node searching step 83.

As explained above, the method constructs the failure candidates searching tree based on the failure dictionary and searches the failure candidates searching tree by using the fail log due to the measuring results of a tester. By doing so, it is possible to efficiently narrow down failure candidates by performing only one time measurement against each address by the tester. Thus, many expensive testers are not occupied for a long time. Consequently, the apparatus and method can efficiently execute failure analysis due to narrowing down of failure candidates.

According to the above-explained embodiments, by selecting a child node at each node of the failure candidates searching tree 11 in a smaller address of which absolute value of a difference between the D-failure number and the U-failure number, it become possible to significantly reduce the time for performing the failure analysis by reducing the narrowing down time for the searching, since the depth of the failure candidates searching tree 11 to an identifying object failure dictionary 19 can be made the smallest.

Further, in one embodiment, it becomes possible to perform similarly the narrowing down, if the failure can be judged as a "Pass" or a "Fail" by the failure simulation and the tester measurement. Thus, it becomes possible to flexibly apply to wider failure modes than the conventional system. Accordingly, it becomes possible to extremely improve an efficiency of the failure analysis.

In the above explained embodiments, the two forked tree is used as the failure candidate searching tree in consideration of a searching efficiency. Of course, the system is not limited to such a tree. It is also possible, for instance, to set all or a part of addresses of which the D-failure number or U-failure number corresponding to an observed candidate is not zero ("0") as child nodes.

In such a failure candidates searching tree, a plurality of roots exists on the tree against one failure mode. Consequently, it is also possible to narrow down the address order in the roots, while the times for constructing the tree and searching will be increased. The address order means failures depending to a history of the input pattern.

In the above-explained embodiments, the failure candidates searching tree is constructed and searched in an address unit. Of course, it is possible to construct the failure candidates searching tree in a test pattern unit. Thus, it is possible to globally specify failure portions of a function unit by searching each test pattern based on the results of tester measurement. In this case, as explained in the embodiment, only one time measurement by the tester is used for one test pattern.

Further, by combining such a global narrowing down and the narrowing down at an address unit, such as explained in the embodiment, it becomes possible to efficiently identify failure candidates in a failure analysis for a large scaled semiconductor apparatus.

To simplify the explanation, in the above-mentioned embodiments, a recurrently operation flow is used in the steps of constructing the failure candidates searching tree 11 and the failure candidates searching step. Of course, it is also possible to execute these operations by replacing a simple loop and adequate finalizing conditions.

Other embodiments of the invention will be apparent to those skilled in the art from consideration of the specification and practice of the invention disclosed herein. It is intended that specification and examples be considered as exemplary only, with a true scope and sprit of the invention being indicated by the following claims.

What is claimed is:

1. A failure candidate identifying system comprising:
   a failure dictionary storing unit configured to store a failure dictionary that is generated by performing a failure simulation by supposing each of a plurality of failure modes against each of a plurality of input patterns;
   a searching tree generating unit configured to construct a failure candidate searching tree by using the failure dictionary, the failure candidates searching tree having a tree structure with nodes including a route node and child nodes, at which data of detect failure candidate and un-detect failure candidate are set respectively corresponding to the failure modes with respect to the input patterns, each of the child nodes having a number of data being less than that of the parent node;
   a test vector generating unit configured to generate test vectors based on the input patterns to provide a test equipment for measuring a semiconductor apparatus so as to obtain fail logs as a result of said measurement;
   a failure candidates searching unit configured to restrict failure candidates by using the failure candidates searching tree and the fail logs;
   a display unit configured to display the restricted failure candidates; and
   means for executing the operations of the failure dictionary storing unit, the searching tree generating unit, the failure candidates searching unit and the display unit.

2. The failure candidate identifying system according to claim 1, wherein supposed failure modes are listed as a table of detect failures and un-detect failures depending upon each result of the failure simulation.

3. The failure candidate identifying system according to claim 1, wherein the data of detect failure candidate and un-detect failure candidate of each of the child nodes is same as one of the detect failure candidate and un-detect failure candidate data of each of the parent nodes.

4. The failure candidate identifying system according to claim 1, wherein one of the failure modes of the input patterns is set at one of the child nodes of the failure candidate searching tree, the selected one of the failure modes having a smallest absolute value of the difference between the detect failure number and the un-detect failure number than that of the parent node.

5. The failure candidate identifying system according to claim 1, wherein the failure candidates searching unit extracts failure candidates by searching a D-node being set as the child node with observing the un-detect failure based on a fail data indicating "Pass" or "Fail" among the fail logs when the fail data is "Fail" and by searching a U-node being set as the child node with observing the detect failure without searching the D-node when the fail data is "Pass".

6. The failure candidate identifying system according to claim 1, wherein the failure candidates searching unit is two forked tree having a P-node and/or a U-node.

7. A failure candidate identifying system for extracting a failure mode which may become a possible failure cause for a semiconductor apparatus by comparing a failure dictionary produced by a failure simulation with a fail log obtained by a tester measurement, the failure candidates identifying system comprising:
   a searching tree generating unit configured to construct a failure candidate searching tree by using the failure dictionary, the failure candidates searching tree having a tree structure with nodes including a route node and child nodes at which data of detect failure candidate and un-detect failure candidate are set respectively corresponding to the failure modes with respect to each of the input patterns, each of the child nodes having a number of data being less than that of the parent node, wherein the searching tree generating unit configured to select one of the failure modes with respect to the input pattern from the failure dictionary to set at one of the child nodes, the selected one of the failure modes having a smaller absolute value of the difference between the detect failure number and the un-detect failure number than that of the parent node;

a failure candidates searching unit configured to extract the failure candidates by searching a D-node being set as the child node with observing the un-detect failure based on a fail data indicating "Pass" or "Fail" among the fail logs when the fail data is "Fail" and by searching a U-node being set as the child node with observing the detect failure without searching the D-node when the fail data is "Pass"; and means for executing the operations of the failure dictionary storing unit, the searching tree generating unit and the failure candidates searching unit.

8. The failure candidate identifying system according to claim 7, further comprising a test vector generating unit configured to compound input patterns as inputs for the test measurement by extracting each of the input patterns failure candidates searching tree without overlapping.

9. A failure candidate identifying method for extracting a failure mode which may become a possible failure cause for a semiconductor apparatus by comparing a failure dictionary produced by a failure simulation with a fail log obtained by a tester measurement using test vectors based on input patterns, the failure candidates identifying method comprising:

constructing a searching tree generating unit configured to construct a failure candidate searching tree by using the failure dictionary, the failure candidates searching tree having a tree structure with nodes including a route node and child nodes at which data of detect failure candidate and un-detect failure candidate are set respectively corresponding to each of the failure modes with respect to each of the input patterns, each of the child nodes having a number of data being less than that of the parent node, one of the failure modes with respect to the input patterns being selected from the failure dictionary to be set at one of the child nodes, the selected one of the failure modes having a smaller absolute value of the difference between the detect failure number and the un-detect failure number than that of the parent node; and failure candidates searching by extracting the failure candidates by searching a D-node being set as the child node with observing the un-detect failure based on fail data indicating "Pass" or "Fail" among the fail logs when the fail data is "Fail" and by searching a U-node being set as the child node with observing the detect failure without searching the D-node when the fail data is "Pass".

10. The failure candidate identifying method according to claim 9, wherein the failure candidates searching tree is a two forked tree having one of the D-node and/or one of the U-node as the child node of the nodes.

11. The failure candidate identifying method according to claim 9, further comprising a test vector compounding to compound input patterns as inputs for the tester measurement by extracting each of the input patterns with respect to the failure candidates searching tree without overlapping.

* * * * *